United States Patent [19]

Shyu et al.

[11] Patent Number: 5,751,189
[45] Date of Patent: May 12, 1998

[54] CHARGE AMPLIFIER FOR MOS IMAGING ARRAY AND METHOD OF MAKING SAME

[75] Inventors: Tai-Ching Shyu, Cupertino; Datong Chen; Jun Liu, both of Fremont, all of Calif.

[73] Assignee: OmniVision Technologies, Inc., Sunnyvale, Calif.

[21] Appl. No.: 617,313

[22] Filed: Mar. 18, 1996

Related U.S. Application Data

[63] Continuation-in-part of Ser. No. 538,441, Oct. 3, 1995, Pat. No. 5,724,095.
[51] Int. Cl.$^6$ .................................................. H03F 1/02
[52] U.S. Cl. ...................... 330/9; 330/51; 348/300; 348/302
[58] Field of Search ..................... 348/300, 302, 348/304, 305; 330/9, 51; 250/214 A

[56] References Cited

U.S. PATENT DOCUMENTS

| | | | |
|---|---|---|---|
| 5,233,180 | 8/1993 | Tsuruta et al. | 250/208.1 |
| 5,345,266 | 9/1994 | Denyer . | |
| 5,448,056 | 9/1995 | Tsuruta | 250/214 A |
| 5,521,555 | 5/1996 | Tazartes et al. | 330/308 |

OTHER PUBLICATIONS

Kawashima, H. et al., A 1/4 inch format 250K pixel amplified MOS image sensor using CMOS process, *IEDM*, pp. 575–578, 1993.

Ozaki, T. et al., A low–noise line–amplified MOS imaging devices, *IEEE*, pp. 969–975, 1991.

*Primary Examiner*—Andrew Faile
*Assistant Examiner*—Christopher Onuaku
*Attorney, Agent, or Firm*—Christenson, O'Connor, Johnson & Kindness PLLC

[57] ABSTRACT

A charge amplifier with DC offset canceling for use in a pixel element of an MOS image sensor is disclosed. The charge amplifier can be manufactured using a standard CMOS single polycrystalline process, making it much more cost effective than prior art designs. The charge amplifier includes an operational amplifier, a source capacitor, a series capacitor, and a feedback capacitor. The source capacitor holds the input signal. The output of the operational amplifier provides the output signal. Switches control the routing of the signal flow from the source capacitor, the series capacitor, and the feedback capacitor.

12 Claims, 15 Drawing Sheets

5,751,189

CHARGE AMPLIFIER FOR MOS IMAGING ARRAY AND METHOD OF MAKING SAME

RELATED APPLICATIONS

This is a continuation-in-part of U.S. patent application Ser. No. 08/538,441 filed Oct. 3, 1995, now U.S. Pat. No. 5,724,095.

FIELD OF THE INVENTION

The present invention relates to metal oxide semiconductor imaging arrays, and more particularly, an improved charge amplifier for use in the array.

BACKGROUND OF THE INVENTION

Integrated circuit technology has revolutionized various fields including computers, control systems, telecommunications, and imaging. In the field of imaging, the charge coupled device (CCD) sensor has made possible the manufacture of relatively low cost and small hand-held video cameras. Nevertheless, the solid-state CCD integrated circuits needed for imaging are relatively difficult to manufacture, and therefore are expensive. In addition, because of the differing processes involved in the manufacture of CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

An alternative low cost technology to CCD integrated circuits is the metal oxide semiconductor (MOS) integrated circuit. Not only are imaging devices using MOS technology less expensive to manufacture relative the CCD imaging devices, for certain applications MOS devices are superior in performance. For example, the pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

Examples of MOS imaging devices are detailed in "A ¼ Inch Format 250K Pixel Amplified MOS Image Sensor Using CMOS Process" by Kawashima et al., *IEDM* 93-575 (1993), and "A Low Noise Line-Amplified MOS Imaging Devices" by Ozaki et al., *IEEE Transactions on Electron Devices*, Vol. 38, No. 5, May 1991. In addition, U.S. Pat. No. 5,345,266 to Denyer titled "Matrix Array Image Sensor Chip" describes a MOS image sensor. The devices disclosed in these publications provide a general design approach to MOS imaging devices.

The primary building block of an image formed by an MOS imaging device is a pixel. The number, size and spacing of the pixels determine the resolution of the image generated by the imaging device. The pixels of a MOS imaging device are semiconductor devices that transform incident light photons into current signals. The signal produced by each pixel is generally extremely small, in the nanoampere range. This small signal is unsuitable for further processing. Thus, a critical component of a MOS image sensor is a series of charge amplifiers that amplify the signals generated by the pixel elements. It is the charge amplifier design and the method of making the same that is the subject of the present invention.

SUMMARY OF THE INVENTION

The present invention is a charge amplifier with DC offset canceling for use in a MOS image sensor. The charge amplifier can be manufactured using a standard CMOS single polycrystalline process, making it much more cost effective than prior art designs. The charge amplifier includes an operational amplifier, a feedback capacitor, a source capacitor, a series capacitor, and several switches (preferably formed from MOS transistors). In addition, a voltage reference is provided to cancel the offset voltage of the operational amplifier. The series capacitor is connected to the negative terminal of the operational amplifier. The positive terminal of the operational amplifier is connected to the voltage reference. The switches operate to alternately route the feedback signal through the series capacitor before being fed to the negative terminal or provide the feedback signal directly to the negative terminal. In the first instance, where the switches operate to route the feedback signal through the series capacitor, the DC offset voltage inherent to the operational amplifier is captured by the series capacitor. In the second instance, where the switches operate to route the feedback signal directly to the negative input, the voltage captured by the series capacitor cancels the DC offset voltage inherent to the operational amplifier.

In accordance with other aspects of the present invention, a capacitor for use in the charge amplifier comprises two series MOS transistors and a control MOS transistor. The gates of the two series MOS transistors are connected to the drain of the control MOS transistor. The drain and source of both of the series MOS transistors are tied together to form the two terminals of the capacitor, respectively. A control signal activates the control transistor to activate the capacitor for operation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
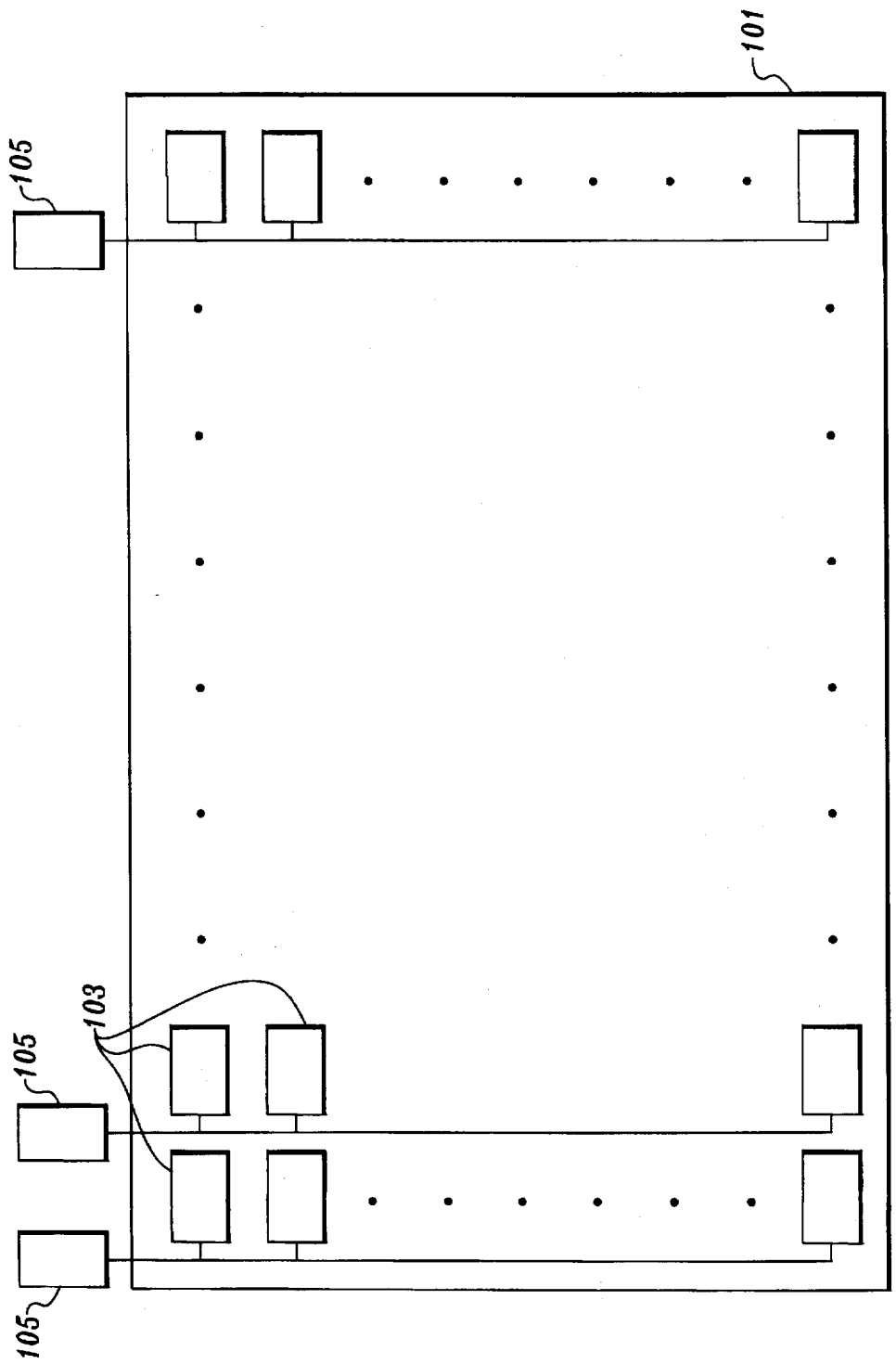
FIG. 1 is a schematic diagram of a CMOS imaging sensor.

With reference to FIG. 1, a CMOS imaging array 101 in accordance with the present invention includes a rectangular matrix of pixels 103. The number of pixels in the horizontal or x-direction, and the number of pixels in the vertical or y-direction, constitutes the resolution of the imaging array 101. Each of the pixels 103 in a vertical column routes its signal to a single charge amplifier 105 (shown in greater detail in FIG. 2). However, at any instant only one of the pixels 105 in a column sends a charge signal to the associated charge amplifier 105. Control circuitry of conventional design is operative to sequentially read the pixels 103 in a scanning manner.

Figure 2:
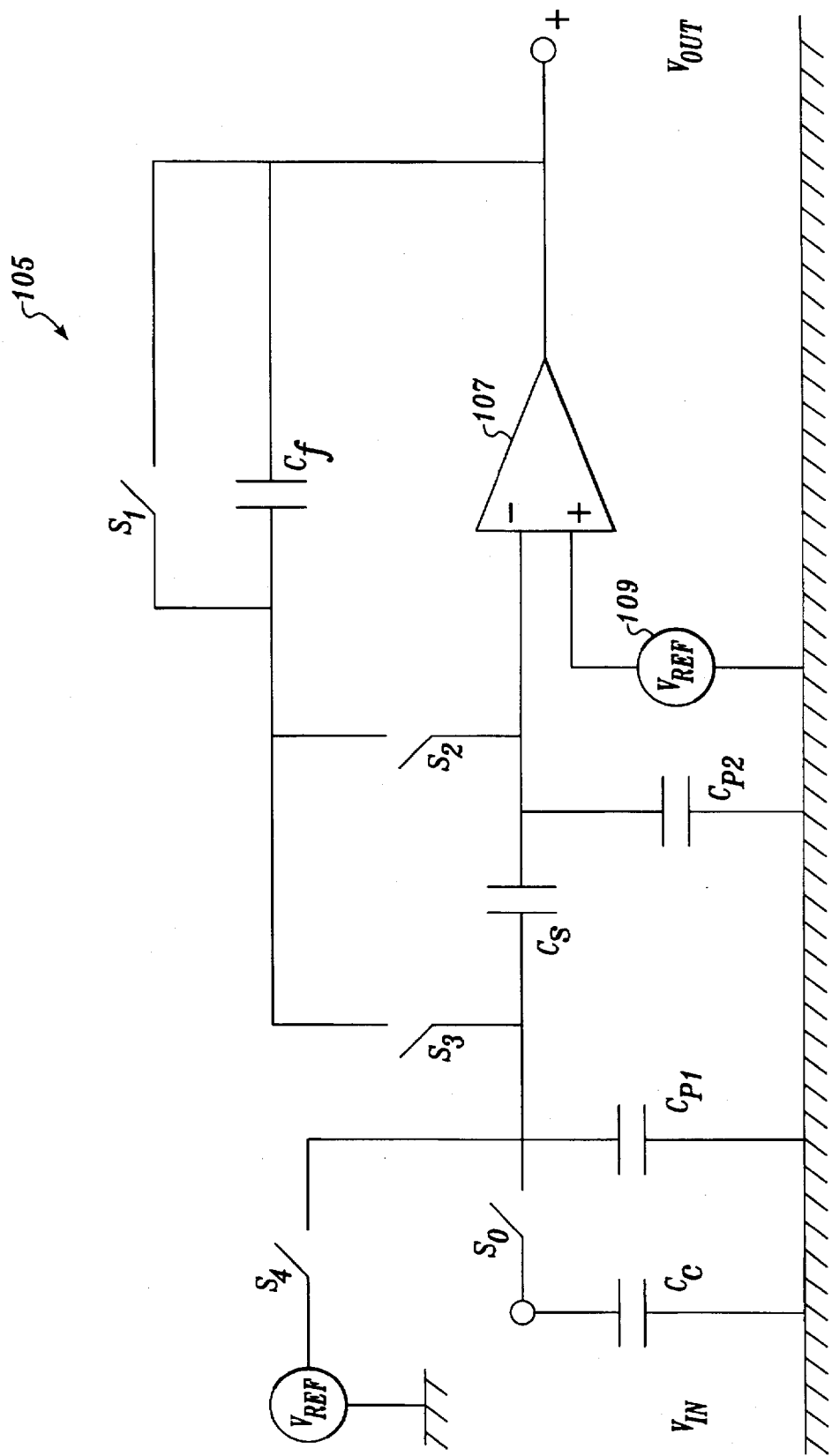
FIG. 2 is a schematic diagram of a CMOS charge amplifier in accordance with the present invention.

As seen in FIG. 2, each charge amplifier 105 (also referred to in the art as a sense amplifier) includes an operational amplifier 107, and a reference voltage source 109 connected between ground and the positive input of the operational amplifier. A source capacitor $C_C$ and a series capacitor $C_S$ are connected in series between ground and the negative input of the operational amplifier. Also represented are two parasitic capacitances $C_{P1}$ and $C_{P2}$. As can be appreciated, the parasitic capacitances are not intentionally formed capacitors, but rather a result of the source capacitor $C_C$ and the series capacitor $C_S$. A feedback capacitor $C_F$ is connected between the negative input and the output of the operational amplifier. In the preferred embodiment and as detailed below, the capacitors are formed by MOS devices. As described below, switches $S_0$–$S_4$ control the routing of the input signal ($V_{IN}$), reference voltage signal ($V_{REF}$) and feedback signal through the amplifier.

In a traditional design for a charge amplifier that includes an operational amplifier, one challenge is to reduce the uncertainty in the DC offset voltage between the negative input (also referred to as the inverting input) and positive input (also referred to as the non-inverting input) of the operational amplifier. As is known in the art, the DC offset voltage between the two inputs of an operational amplifier is an unavoidable but, usually, undesirable artifact of the design and manufacture of an operational amplifier. In some circumstances, the presence of a DC offset voltage in the charge amplifiers 105 would be acceptable i.e., if all of the DC offset voltages in the operational amplifiers were equal in magnitude and polarity. However, because of variations in manufacture of the operational amplifiers, the DC offset voltage will vary from operational amplifier to operational amplifier. The uncertainty of the DC offset voltage between operational amplifiers, and thus the charge amplifiers 105, interferes with the performance and integrity of the image formed by the MOS imaging array. In the case of a charge amplifier used in video applications, variations in the DC offset voltage manifests itself as bright and dark vertical lines in the picture. The present invention provides a charge amplifier 105 that eliminates or greatly lessens the effect of variable DC offset voltages.

Figure 1A:
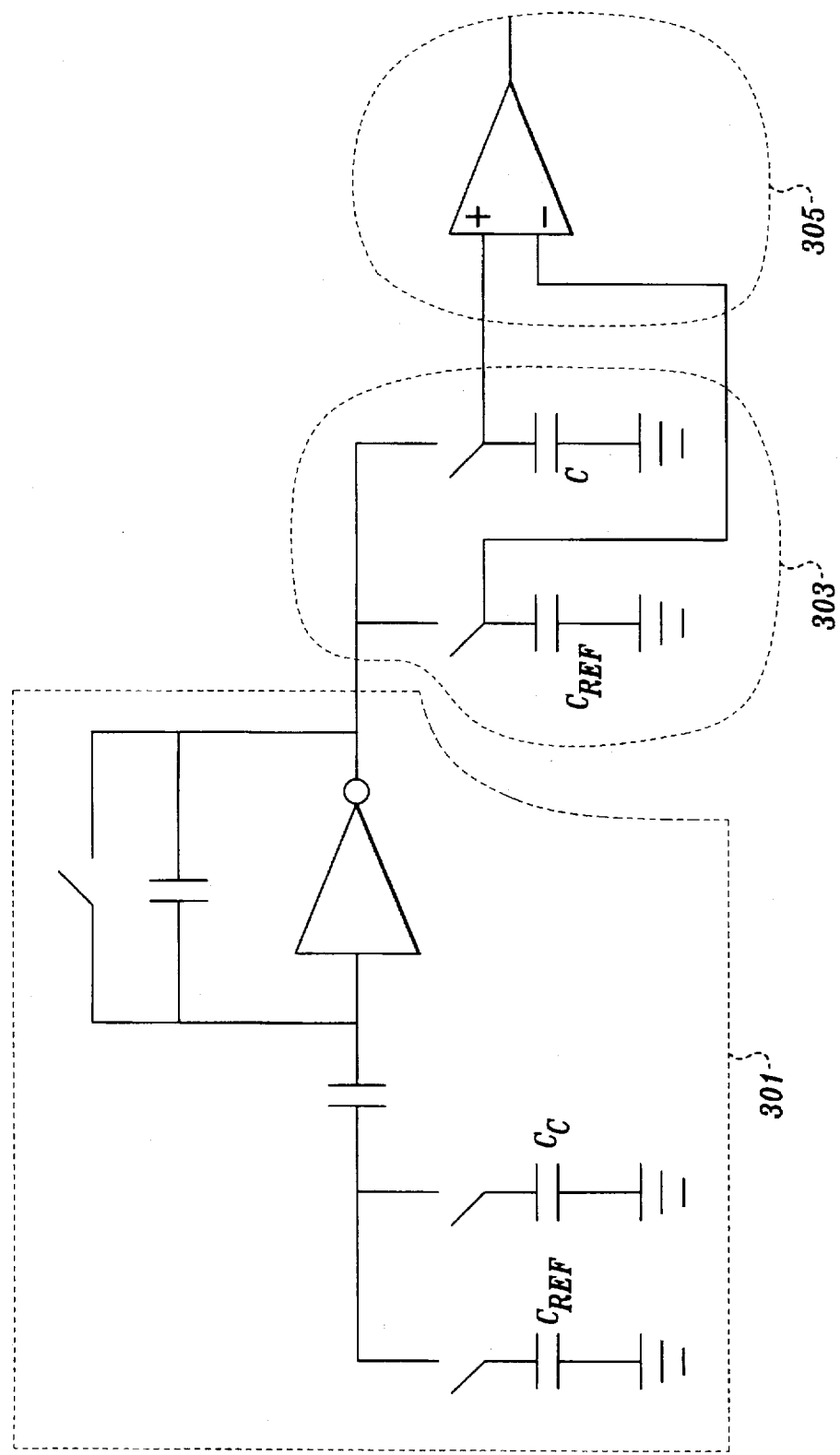
FIG. 1A is a schematic diagram of a prior art CMOS charge amplifier.

As seen in FIG. 1A, a prior art design for a charge amplifier that reduces DC offset voltage is shown. The charge amplifier includes a first amplification stage 301, dual storage 303, and a second amplification stage 305. The first amplification stage 301 performs a standard amplification of the input signal. Dual storage 303 stores the output of the first amplification stage 301 and, in conjunction with the second amplification stage 305, serves to cancel the DC offset voltage of the first amplification stage 301. However, as can be seen in FIG. 1A, the number of capacitors necessary is double that of a charge amplifier without DC offset compensation, adding to size and manufacturing complexity of the circuit. In addition, supplementary electronic routing is required. The extra routing tends to introduce noise into the signal. Furthermore, as can be appreciated by those skilled in the art, in the case of color sensors, there are many additional outputs that require an even greater number of capacitors and routing. Thus, this prior art charge amplifier has significant disadvantages.

Returning to FIG. 2, the transfer function of the charge amplifier 105 of the present invention can be calculated using known relationships. If the open loop gain (denoted as $A_V$) of the operational amplifier 107 is sufficiently high such that $A_V C_F$ is much larger than $C_{P1}$ and if $C_S$ is much larger than $C_{P2}$, then the final gain is approximated as:

$$V_{OUT}=V_{IN}*(C_C/C_F)-V_{REF} \quad \text{Eq.(1)}$$

The inclusion of a reference voltage $V_{REF}$ shifts the entire input signal $V_{IN}$ to a higher magnitude for easier processing. Specifically, because the input signal $V_{IN}$ is typically very small, near a voltage level of ground, it is difficult for the operational amplifier 107 to process the signal. By shifting the input signal $V_{IN}$ to a higher magnitude (where the input signal piggybacks onto the $V_{REF}$ signal), the operational amplifier 107 can operate at a more optimum range. In addition, this allows the operational amplifier used in the imaging array 101 to operate on a single power supply. Thus, although a reference voltage $V_{REF}$ is included in the preferred embodiment, it can be appreciated by those skilled in the art that $V_{REF}$ may be a ground signal (i.e. grounded).

Figure 2A:
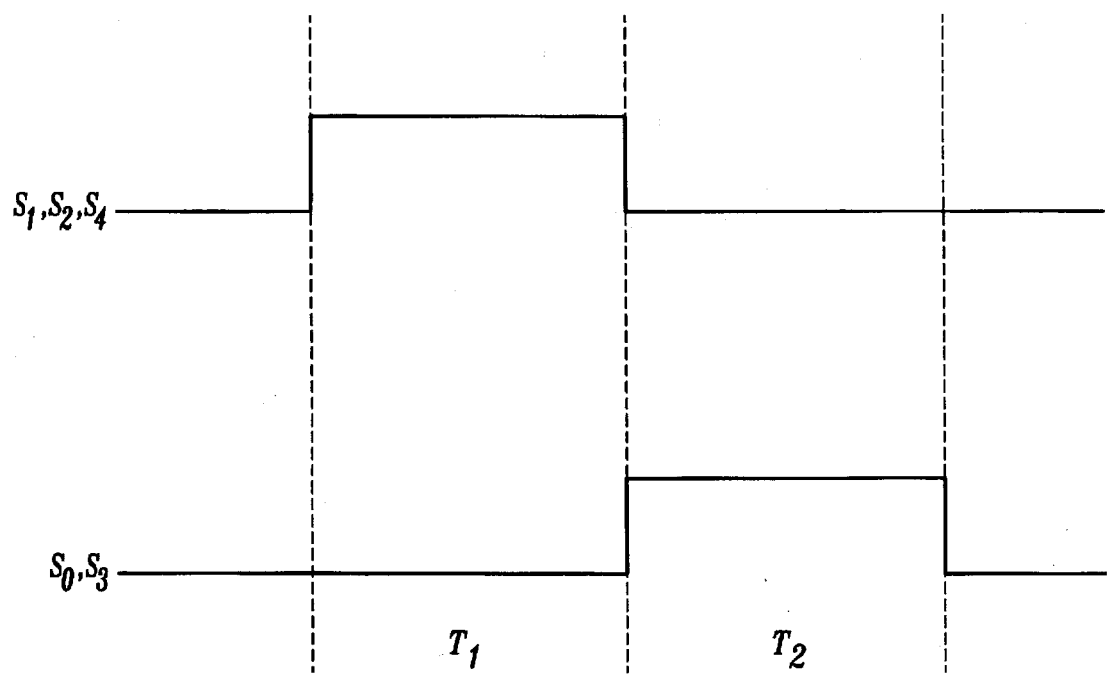
FIG. 2A is a timing diagram illustrating the operation of the CMOS charge amplifier of FIG. 2.

The inclusion of series capacitor $C_S$ in conjunction with controlled operation of the switches is operative to cancel any DC offset voltage in the operational amplifier. Switch $S_1$ is in parallel with feedback capacitor $C_F$; switch $S_2$ is between the negative input of the operational amplifier and the input side of feedback capacitor $C_F$; switch $S_3$ is between the input side of $C_F$ and a node between $C_S$ and $C_{P1}$; switch $S_4$ is between the reference voltage source and the node between $C_S$ and $C_{P1}$; and switch $S_0$ is between the source capacitor $C_C$ and the node between $C_S$ and $C_{P1}$ (i.e., in the path between the source capacitor $C_C$ and the series capacitor $C_S$). FIG. 2A is a timing diagram of the charge amplifier 105 when in operation. In particular, during time $T_1$, switches $S_1$, $S_2$, and $S_4$ are closed and switches $S_0$ and $S_3$ are open. The closing of switches $S_1$ and $S_2$ bypasses the feedback capacitor and connects the output of operational amplifier 107 directly to the negative input of operational amplifier 107. Closing of switch $S_4$ holds the input side of series capacitor at $V_{REF}$.

Figure 2B:
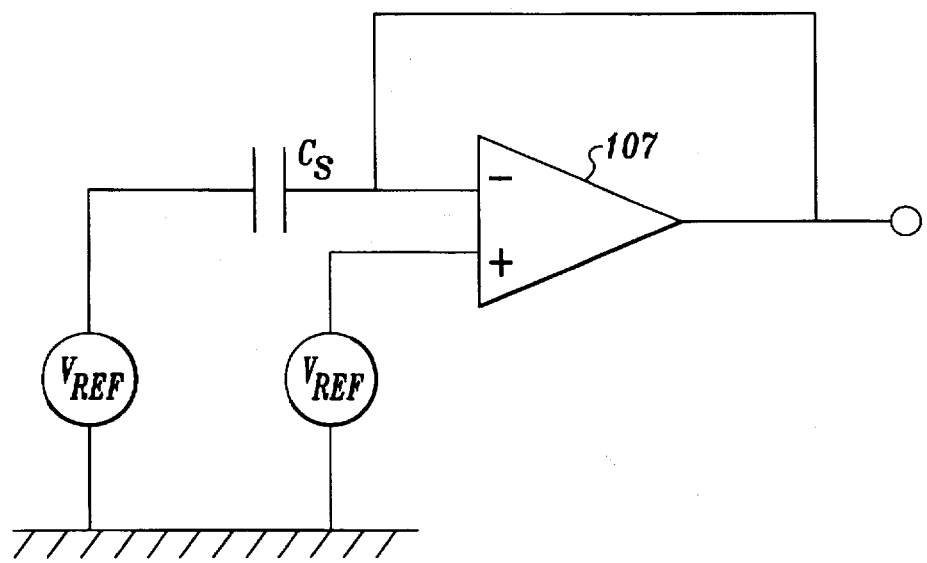
FIG. 2B is a circuit diagram illustrating the charge amplifier of FIG. 2 during a preparation period.

Because the positive input of operational amplifier 107 is held to voltage $V_{REF}$ and the input side of series capacitor $C_S$ is also held to voltage $V_{REF}$, the circuit performs as shown in FIG. 2B (ignoring the inconsequential effects of $C_{P1}$ and $CP_2$). The voltage across series capacitor $C_S$ is equal in magnitude to the DC offset voltage between the inputs of the operational amplifier 107. It should be noted that the input side of $C_S$ is held at $V_{REF}$ while the output side of $C_S$ is connected to the negative input of the operational amplifier. Thus, it can be said that the series capacitor $C_S$ stores a voltage that is equal to the DC offset voltage, and of opposite polarity. The time period $T_1$ during which switches $S_1$, and $S_2$ and $S_4$ are closed is referred to as the preparation period, because during time period $T_1$, the charge amplifier 105 is preparing to acquire and amplify the input signal $V_{IN}$.

Figure 2C:
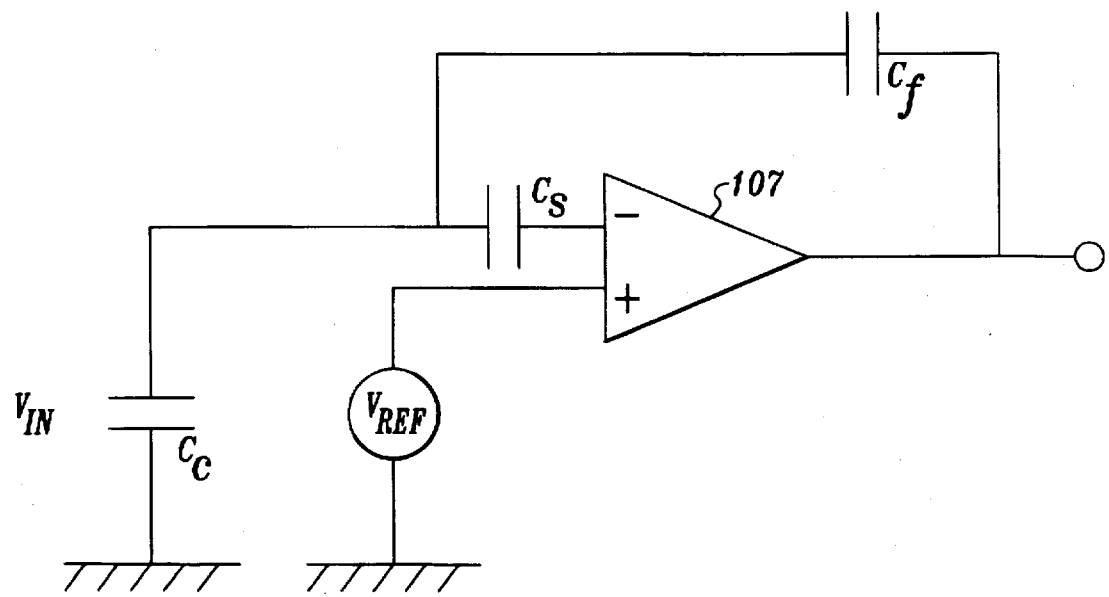
FIG. 2C is a circuit diagram illustrating the charge amplifier of FIG. 2 during a amplification period.

Next, at time $T_2$, switches $S_1$, $S_2$, and $S_4$ are opened and switches $S_0$ and $S_3$ are closed. The circuit performs as shown in FIG. 2C (again ignoring the inconsequential effects of $C_{P1}$ and $C_{P2}$). The input signal $V_{IN}$ is fed through the series capacitor $C_S$ to the operational amplifier 107. The feedback signal flows through the feedback capacitor $C_F$. As can be appreciated, this configuration is a normal amplification arrangement for the input signal $V_{IN}$. Any DC offset voltage in operational amplifier 107 is momentarily cancelled by the equal and opposite voltage stored across series capacitor $C_S$, obtained during the preparation period. The time period $T_2$ when switches $S_1$ and $S_3$ are closed is referred to as the amplification period because during time period $T_2$, the charge amplifier 105 is amplifying the input signal $V_{IN}$. Thus, as can be seen, the charge amplifier 105, by inclusion of series capacitor $C_S$ and the switching mechanisms, is operative to cancel any DC offset voltage inherent in the operational amplifier 107 for the very brief period of actuation of a pixel.

Figure 2D:
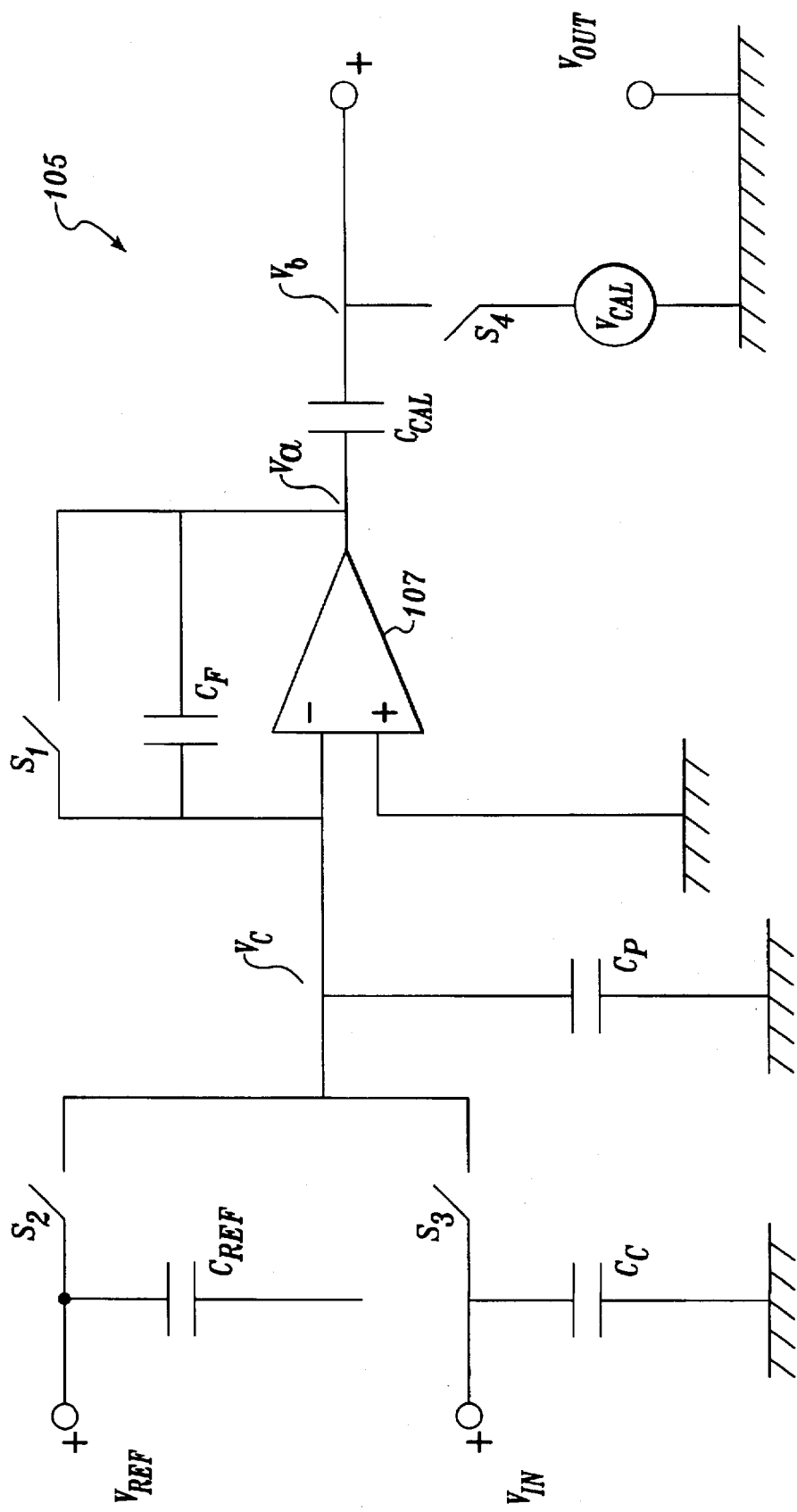
FIG. 2D is a schematic diagram of an alternative embodiment of a CMOS charge amplifier in accordance with the present invention.
Figure 2E:
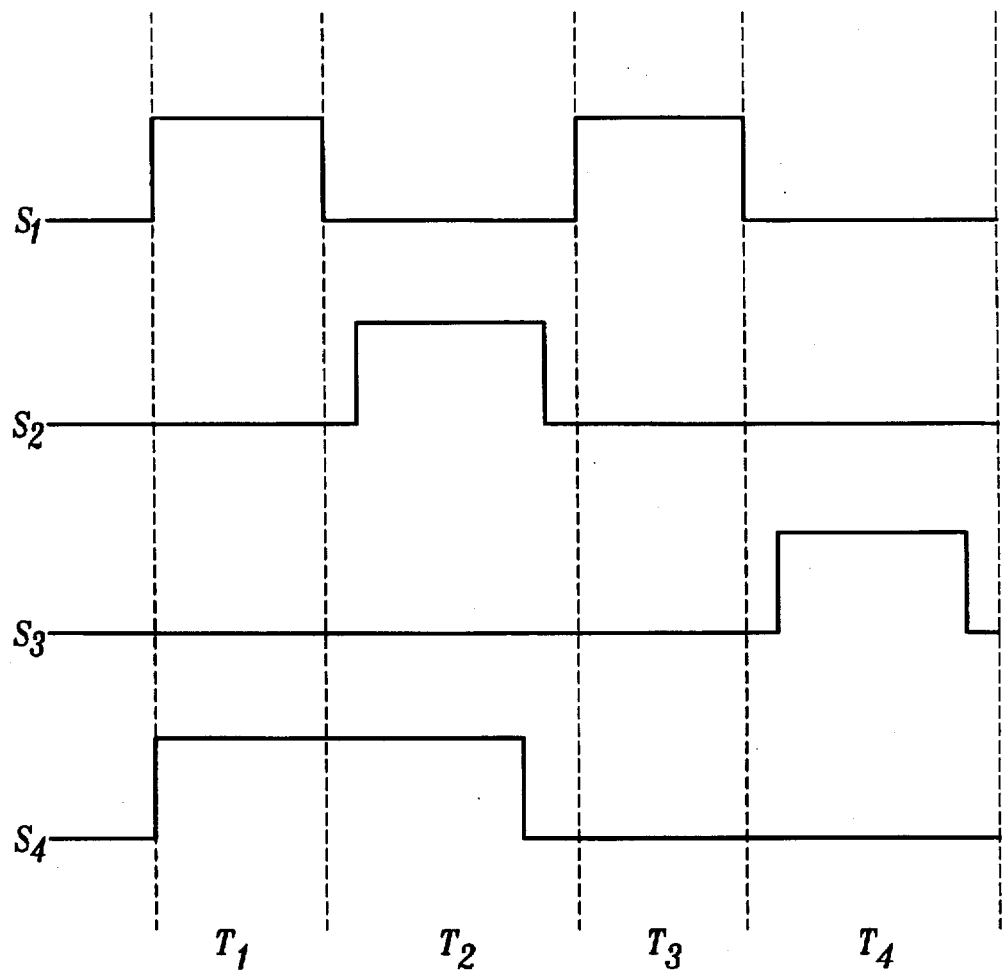
FIG. 2E is a timing diagram illustrating the operation of the CMOS charge amplifier of FIG. 2D.
Figure 2F:
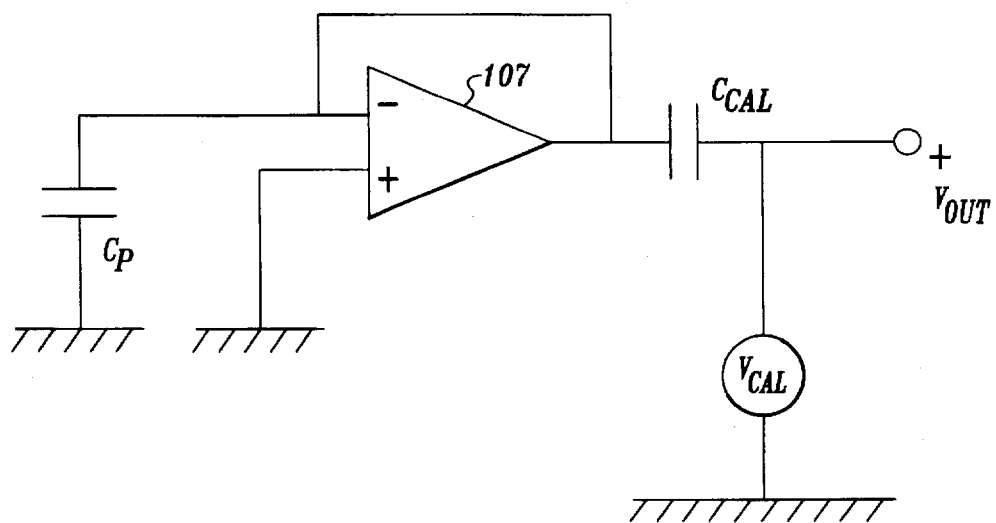
FIG. 2F is a circuit diagram illustrating the charge amplifier of FIG. 2D during a first time period.

An alternative preferred embodiment of the charge amplifier 105 is shown in FIG. 2D. The charge amplifier 105 includes an operational amplifier 107, a feedback capacitor $C_F$, a reference capacitor $C_{REF}$, a source capacitor $C_C$, a parasitic capacitor $C_P$, a calibration capacitor $C_{CAL}$, and a calibration voltage source $V_{CAL}$. The feedback capacitor $C_F$ is connected between the inverting input and the output of the operational amplifier 107. Switch $S_1$ is also between the inverting input and the output of the operational amplifier 107. Thus, switch $S_1$ allows $C_F$ to be bypassed. The reference capacitor $C_{REF}$ is between ground and switch $S_2$. The parasitic capacitor $C_P$, between the inverting input of operational amplifier 107 and ground, is not an intentionally formed capacitor, but rather a result of the formation of the other circuit structures.

Switch $S_2$ is between $C_{REF}$ and the inverting input of the operational amplifier 107. The source capacitor $C_C$ is between ground and switch $S_3$. Switch $S_3$ is between $C_C$ and the inverting input of the operational amplifier 107. The calibration capacitor $C_{CAL}$ is between the output of the operational amplifier 107 and the output node $V_{OUT}$. Finally, switch $S_4$ and voltage source $V_{CAL}$ are in series between the output node $V_{OUT}$ and ground. In addition, noted on FIG. 2D are various voltage nodes $V_a$, $V_b$, and $V_c$, which will be used to identify the voltage at the respective nodes.

In the preferred embodiment and as detailed below, the capacitors are formed by MOS devices. As described below, switches $S_1$-$S_4$ control the routing of the input signal ($V_{IN}$), reference voltage signal ($V_{REF}$) and feedback signal through the operational amplifier 107. The voltage stored across $C_{REF}$ is referred to as reference voltage $V_{REF}$. The voltage stored across $C_C$ is referred to as input voltage $V_{IN}$.

The operation of the charge amplifier 105 is next described in connection with FIGS. 2E–2I. First, at time period $T_1$, the charge amplifier 105 appears as in FIG. 2F. Switches $S_1$ is closed to allow the voltage at nodes $V_a$ and $V_c$ to equalize. In addition, closing of switch $S_4$ allows the voltage at node $V_b$ to be clamped at $V_{CAL}$. It should be noted that $V_{CAL}$ is relatively arbitrary and may be set at a level that facilitates further processing. Indeed, $V_{CAL}$ may be ground. The time period $T_1$ is referred to as the equalizing period.

Figure 2G:
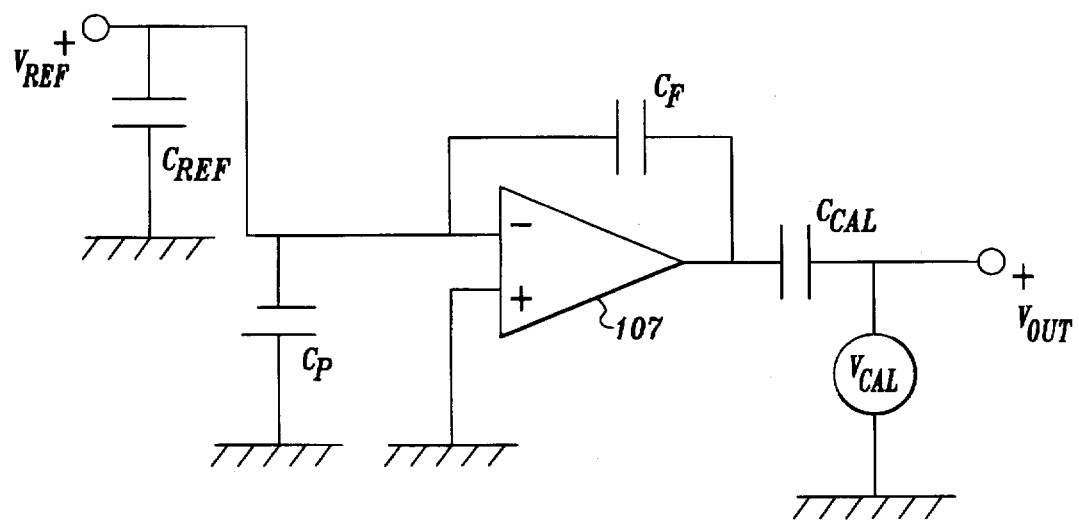
FIG. 2G is a circuit diagram illustrating the charge amplifier of FIG. 2D during a second time period.

Next, at time period $T_2$, the charge amplifier 105 appears as in FIG. 2G. Note, however, that at the very beginning of time period $T_2$, switch $S_1$ is opened and switch $S_4$ is still closed and switch $S_2$ is still open. The closing of switch $S_2$ is delayed briefly (on the order of 25 nanoseconds) to prevent signal equalization between $V_a$ and $V_{REF}$.

After the brief delay to prevent equalization of $V_a$ and $V_{REF}$, the signal $V_{REF}$ signal is amplified by operational amplifier 107. The transfer function of the circuit during the middle of time period $T_2$ is given by:

$$V_a - V_{OUT} = \frac{A_V C_{REF}}{C_P + A_V C_F} * V_{REF} + \Delta V - V_{CAL} \qquad \text{Eq. (1)}$$

Eq. (1) gives the charge across the calibration capacitor $C_{CAL}$, where $A_V$ is the open loop gain of the operational amplifier 107 and $-V$ is the DC offset voltage. Note that Eq. (1) depends upon $-V$, the DC offset voltage. During the bulk of period $T_2$, the output of the operational amplifier 107 is allowed to settle to its final value. It can be appreciated by those skilled in the art that the longer the time period $T_2$ is, the closer the output of the operational amplifier 107 approaches the nominal final value.

Near the completion of time period $T_2$, switch $S_4$ opens and the voltage at $V_b$ is allowed to float. This allows the voltage at $V_b$ to float with any noise transients caused by the later opening of switch $S_2$. Next, switch $S_2$ is opened, and briefly thereafter, switch $S_1$, is closed. Again, switch $S_2$ is opened before the closing of switch $S_1$ to prevent equalization between $V_{REF}$ and $V_a$.

Figure 2H:
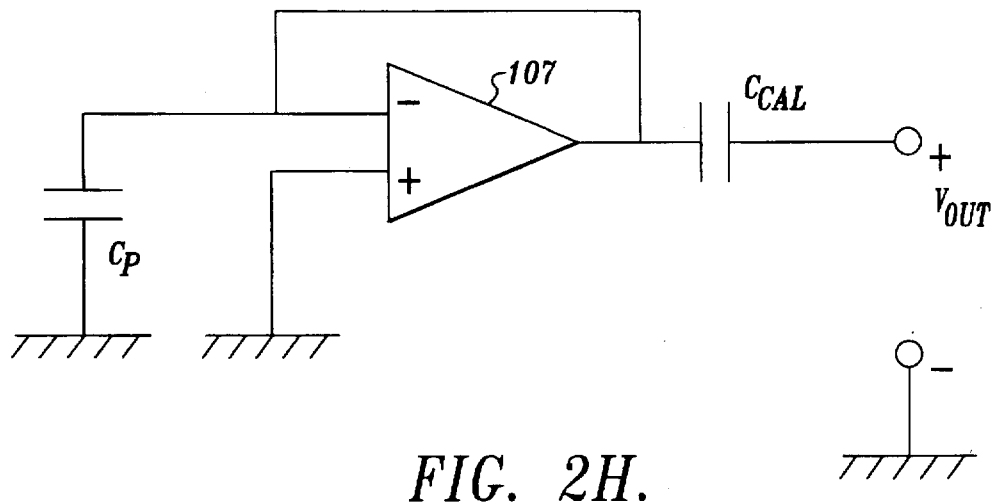
FIG. 2H is a circuit diagram illustrating the charge amplifier of FIG. 2D during a third time period.

At time period $T_3$, switch $S_1$ is closed and all other switches are open, resulting in the circuit shown in FIG. 2H. This results in an equalization between the voltages at $V_a$ and $V_c$. In addition, switch $S_4$ remains open to avoid clamping of $V_b$ to $V_{CAL}$ which would cause a loss in the amplified reference signal.

Next, at time period $T_4$, switch $S_1$ is opened so that the input signal $V_{IN}$ can be amplified by the operational amplifier 107. In addition, switch $S_3$ is closed. In the preferred embodiment, time periods $T_1$ and $T_3$ are 175 nanoseconds and time periods $T_2$ and $T_4$ are 700 nanoseconds. Further, it can be appreciated that the activation of the switches is accomplished with timing circuitry of conventional design.

Figure 2I:
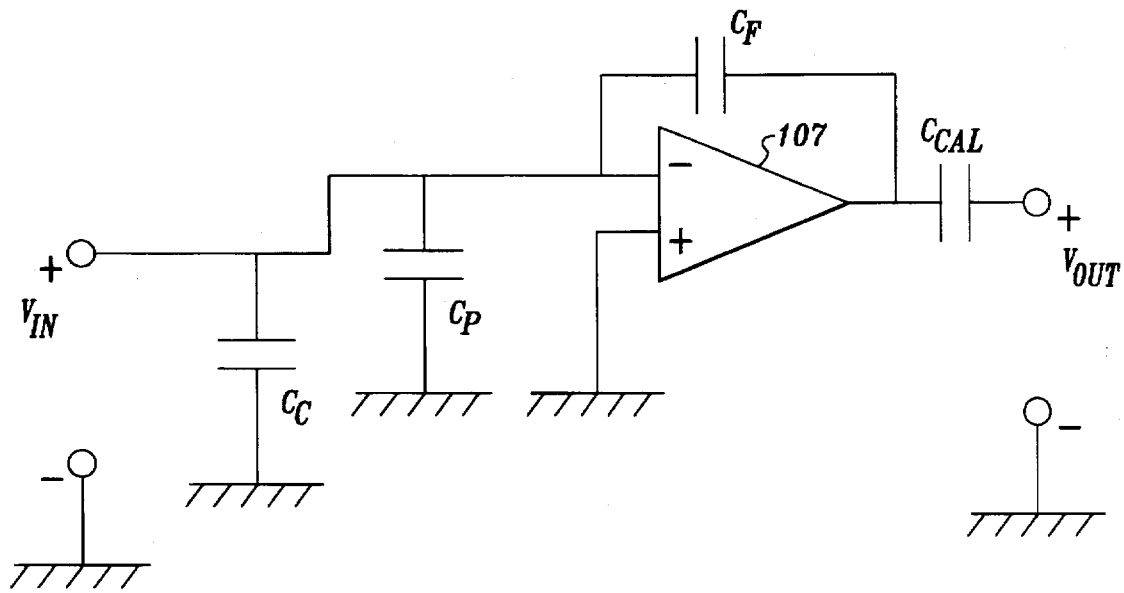
FIG. 2I is a circuit diagram illustrating the charge amplifier of FIG. 2D during a fourth time period.

The circuit during time period $T_4$ appears as in FIG. 2I. Note again that the closing of switch $S_3$ is delayed briefly (on the order of 25 nanoseconds) to prevent signal equalization between $V_a$ and $V_{IN}$. The resulting transfer function is given by:

$$V_a = \frac{A_V C_C}{C_P + A_V C_F} * V_{IN} + \Delta V \qquad \text{Eq. (2)}$$

With Eq. (1) and Eq. (2), $V_{OUT}$ can be solved to give (assuming that $A_V$ is large):

$$V_{OUT} = \frac{C_C}{C_F} * (V_{IN} - V_{REF}) + V_{CAL} \qquad \text{Eq. (3)}$$

Note that Eq. (3) assumes that $C_C$ and $C_{REF}$ are approximately equal. However, $C_{REF}$ may be different from $C_C$; Eq. (3) would simply be a bit more complicated. More importantly, Eq. (3) does not depend upon the DC offset voltage $\Delta V$. Thus, the circuit eliminates the DC offset voltage in the charge amplifier.

One advantage of this embodiment is that the DC offset compensation is done at the output side of the operational amplifier. This prevents noise from entering into the charge amplifier system from the switching of the storage capacitor $C_S$ in the embodiment of FIG. 2. However, a more difficult timing cycle is necessary in order to implement this embodiment.

Another issue that arises is the manufacture in MOS processes the capacitors $C_S$ and $C_F$. In particular, in order to manufacture the charge amplifier 105 that behaves in accordance with Eq. (1), large and stable capacitors $C_S$ and $C_F$ must be available. In the prior art, there are three methods of manufacturing capacitors using VLSI process. First, a capacitor (known as a junction capacitor) could be formed by the junction of a pn diode. However, as can be appreciated by those skilled in the art, this capacitor is difficult to use and its capacitance value varies as the voltage across the junction capacitor changes.

The second type of capacitor is referred to as the MOS channel capacitor. The source and drain of a MOS transistor are tied together. The gate serves as one "plate" of the capacitor and the source/drain-combination as the other "plate" of the capacitor. The oxide material serves as the dielectric. This MOS channel capacitor suffers from the same disadvantages as the junction capacitor, namely, the capacitance of the MOS channel capacitor varies as a function of the voltage across the capacitor.

Finally, the third type of capacitor is referred to as the poly2 to poly1 capacitor. This capacitor involves the inclusion of two polycrystalline materials in proximity to each other. This type of capacitor requires extra manufacturing steps due to the requirement of a second polycrystalline material. In addition, the capacitance is relatively low compared to the amount of integrated circuit space necessary to fabricate such a capacitor. Moreover, the capacitance does not relate to any other MOS parameters.

Figure 3:
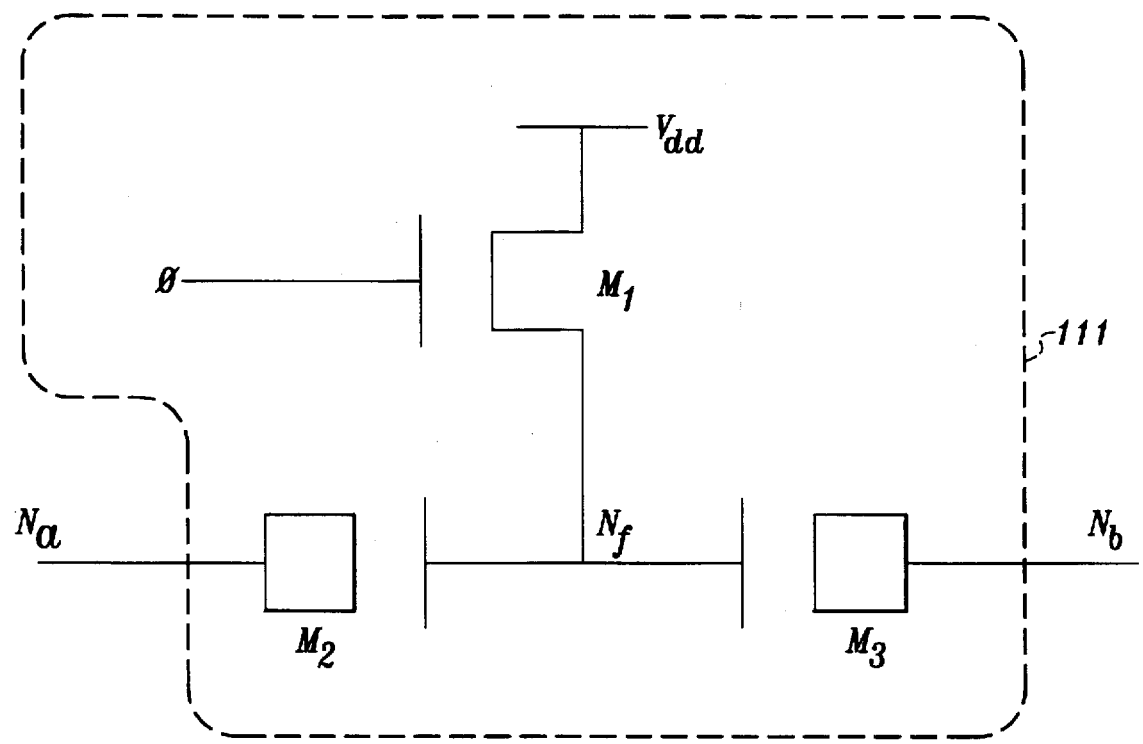
FIG. 3 is a circuit diagram of a capacitor formed using an NMOS process for use in the charge amplifier of FIG. 2.

FIG. 3 illustrates a new design for a large stable capacitor that does not suffer from any of the disadvantages of the other prior art MOS capacitors. The capacitor is formed from three MOS transistors $M_1$, $M_2$, and $M_3$. The gates of transistors $M_2$ and $M_3$ are tied together, along with the drain of transistor $M_1$. The source of transistor $M_1$ is connected to a voltage source $V_{dd}$. In the preferred embodiment, $V_{dd}$ is set to 5.0 volts.

Figure 3A:
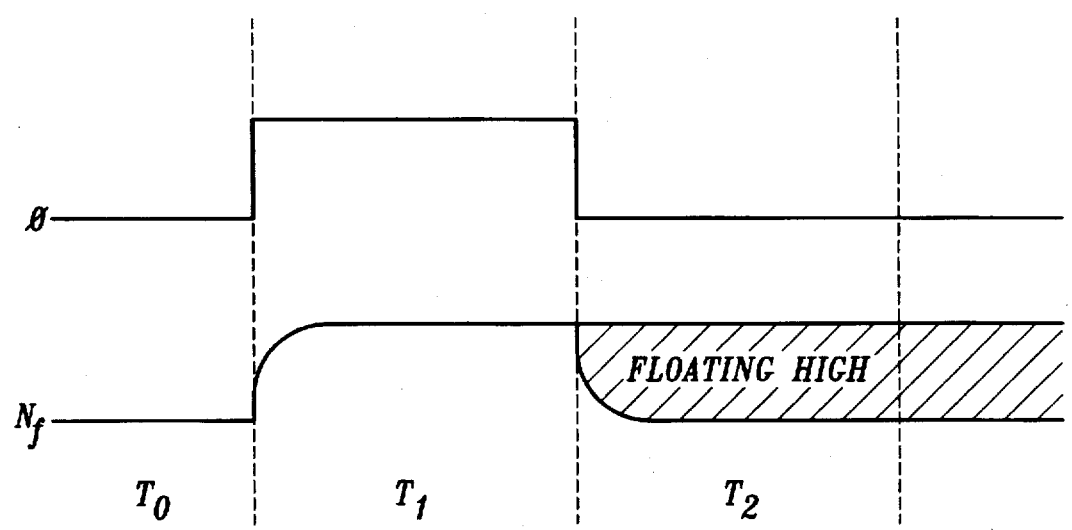
FIG. 3A is a timing diagram illustrating the operation of the capacitor of FIG. 3.

The operation of the capacitor can be explained in connection with the timing diagram of FIG. 3A. At time $T_1$, transistor $M_1$ is turned on by a signal $\phi$. This causes node $N_f$ to reach a voltage equal to $V_{dd}-V_t$, where $V_t$ is the threshold voltage of transistor $M_1$. At time $T_2$, transistor $M_1$ is turned off. This causes the voltage at node $N_f$ to float at $V_{dd}-V_t$. A capacitor is then formed by the transistors $M_2$ and $M_3$ in series. In such a manner, an easy to fabricate capacitor is provided. However, this design has the disadvantage of a limited operating range. For example, the voltages at nodes $N_a$ and $N_b$ must be lower than $V_{dd}-2*V_t$. If the voltages at these nodes rise above this level, the capacitance of the MOS channel capacitor depletes.

Figure 4:
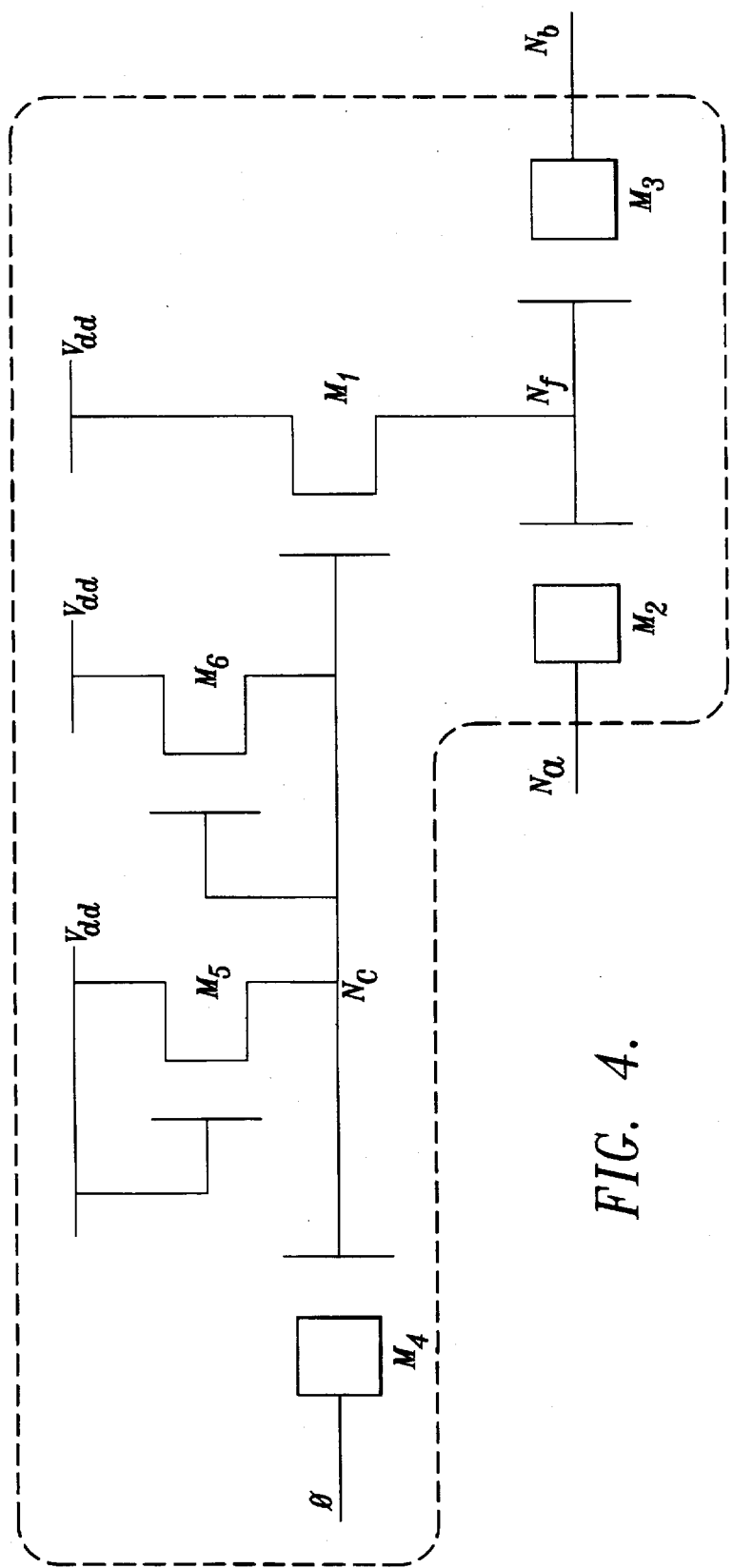
FIG. 4 is a schematic diagram of an alternative embodiment of a capacitor using an NMOS process for use in the charge amplifier of FIG. 2.

To remedy the limited operating range of the embodiment of FIG. 3, the design of FIG. 4 is provided. FIG. 4 provides a similar arrangement to the capacitor of FIG. 3 with the addition of transistors $M_4$, $M_5$, and $M_6$. As seen, the drains of transistors $M_5$ and $M_6$ are tied to the gate of transistor $M_1$. Further, the gates of transistors $M_4$ and $M_6$ are tied to the gate of transistor $M_1$. The gate of transistor $M_5$ is tied to $V_{dd}$. Finally, transistor $M_4$ is configured into a MOS channel capacitor configuration, i.e., the source and drain of transistor $M_4$ are tied together. In the preferred embodiment, transistors $M_4-M_6$ are sharable amongst a plurality of capacitors. Thus, a plurality of combinations of transistors $M_1-M_3$ can share the transistors $M_4-M_6$. To put it another way, the combination of $M_4-M_6$ provide an output that can be routed to several of the combinations of $M_1-M_3$, thus forming several capacitors.

Figure 4A:
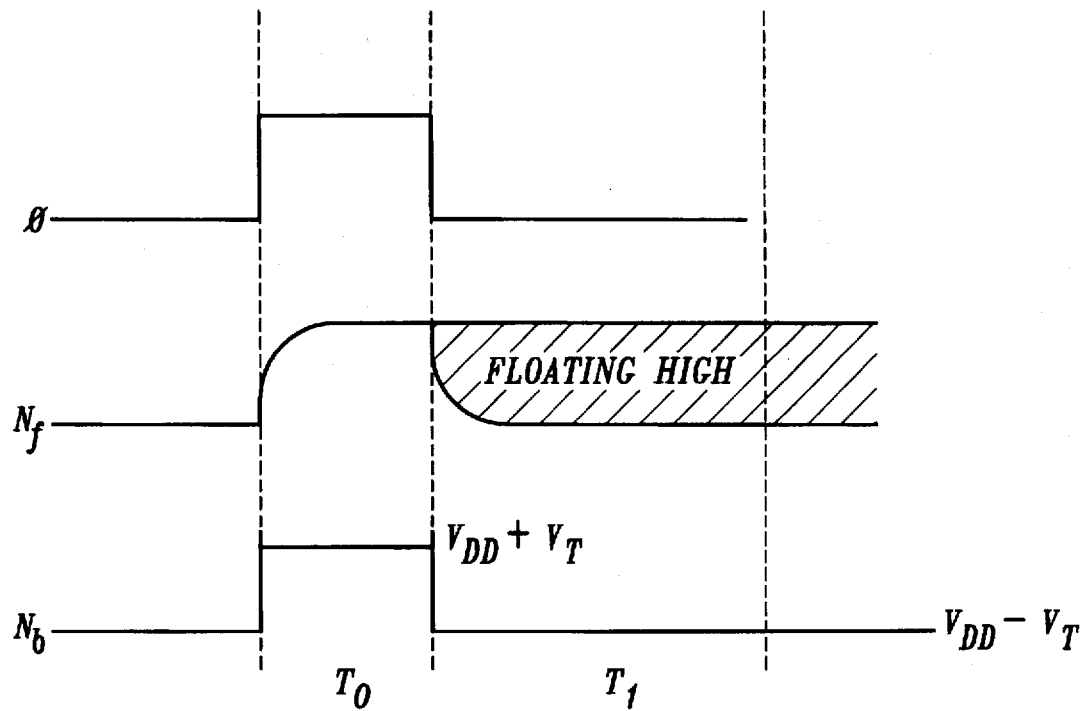
FIG. 4A is a timing diagram illustrating the operation of the capacitor of FIG. 4.

The operation of the capacitor can be understood with further reference to FIG. 4A. During time $T_0$, the signal $\phi$ is high which causes the voltage at node $N_c$ to become $V_{dd}-V_t$. As a consequence, the voltage at node $N_f$ is charged to $V_{dd}$. During time $T_1$, signal $\phi$ returns to low resulting in the voltage at node $N_c$ to be clamped at $V_{dd}-V_t$. The voltage at node $N_f$ is floating at $V_{dd}$ and the capacitor is ready for use. The operating range of this capacitor becomes $V_{dd}-V_t$ for the upper limit and $V_{dd}-3*V_t$ for the lower limit, which is sufficient in many applications.

Figure 5:
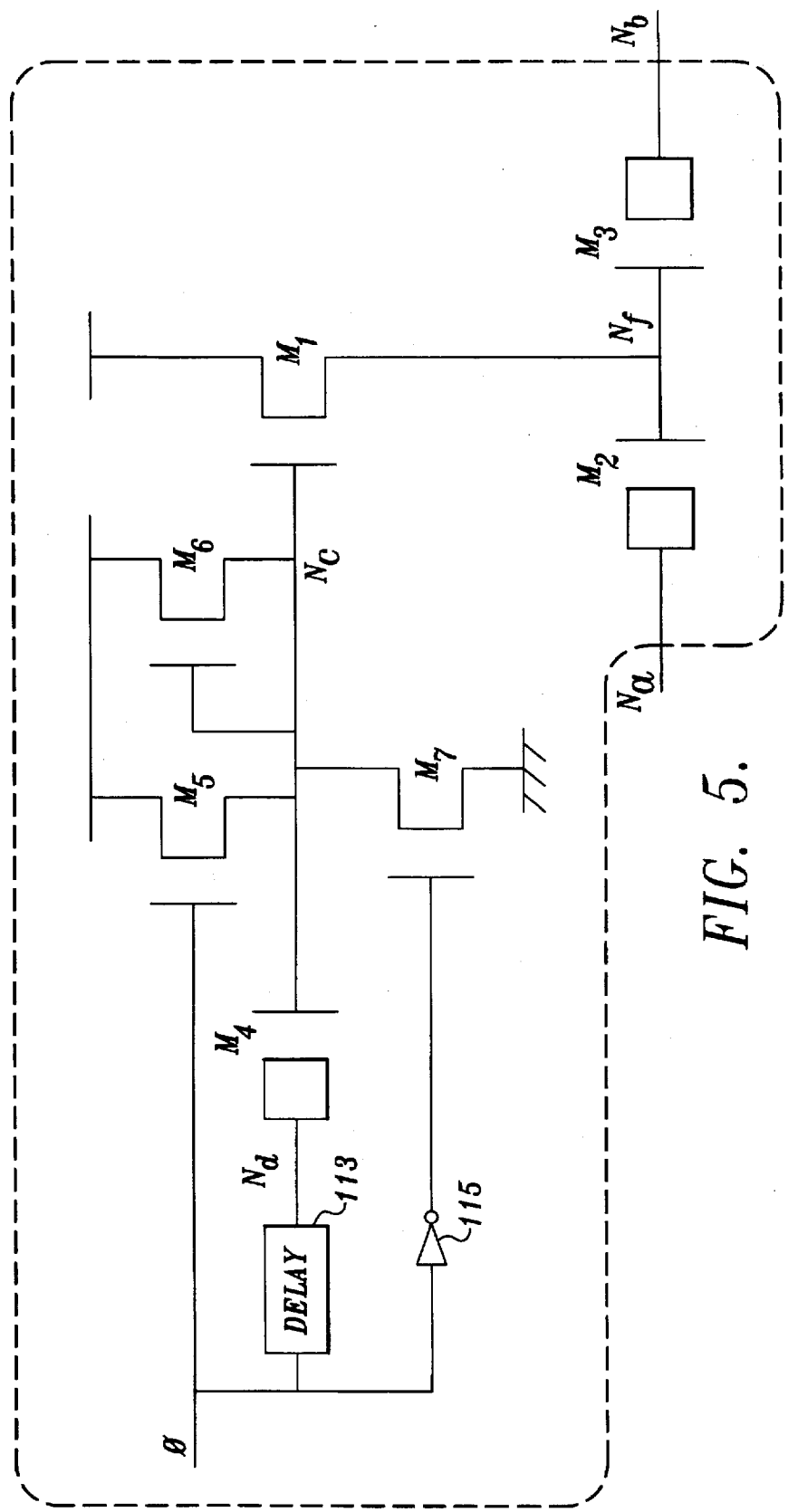
FIG. 5 is a schematic diagram of another alternative embodiment of a capacitor using an NMOS process for use in the charge amplifier of FIG. 2.
Figure 5A:
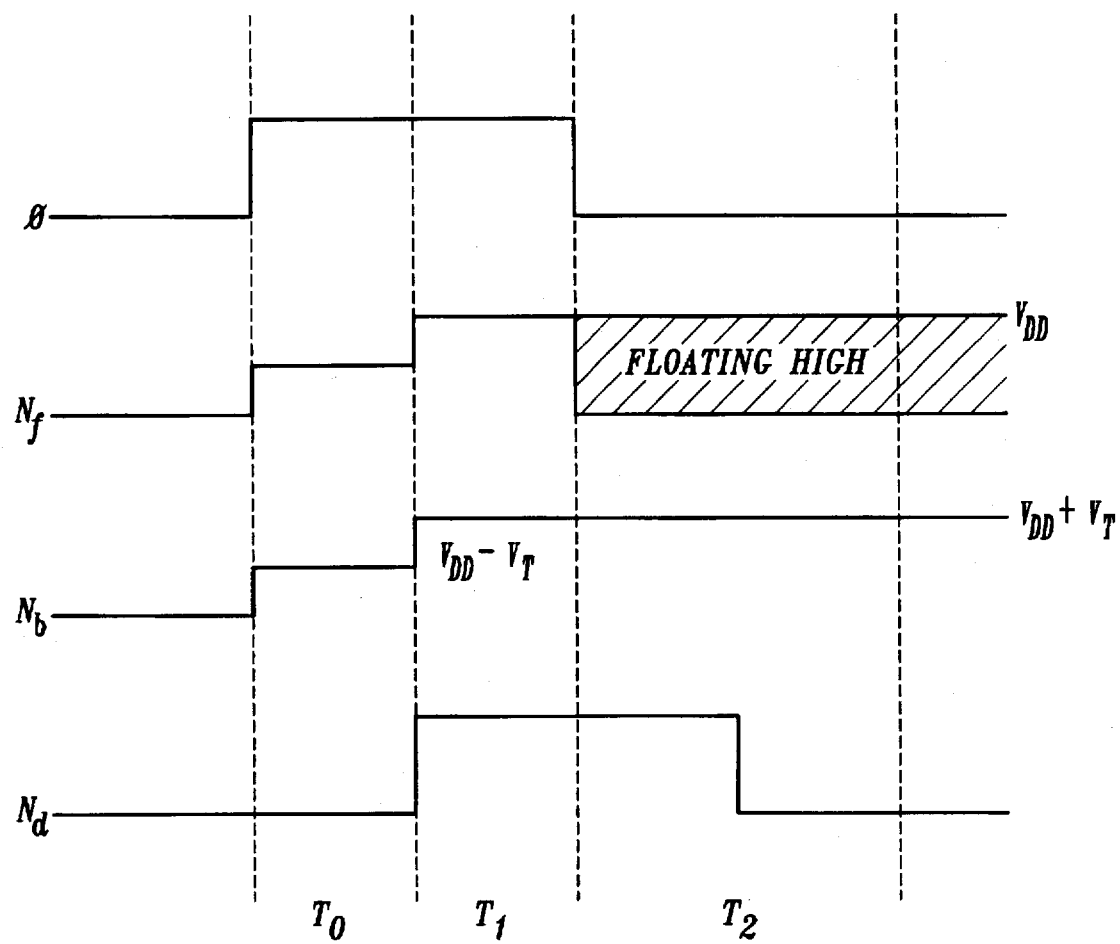
FIG. 5A is a timing diagram illustrating the operation of the capacitor of FIG. 5.

A further improved capacitor is seen in FIG. 5 which further includes a transistor $M_7$, a delay element 113 and an inverter 115. These additional elements are also shareable amongst a plurality of basic capacitors formed from transistors $M_1-M_3$. In operation, referring to FIG. 5A, during time $T_0$, signal $\phi$ goes high and the voltage at node $N_c$ is charged to $V_{dd}-V_t$. After a delay caused by delay 113, during time $T_1$, the voltage at node $N_c$ is boosted to $V_{dd}+V_t$. This charges the voltage at node $N_f$ to $V_{dd}$. During time $T_2$, signal phi returns to low and transistor $M_7$ is turned on. This in turn causes the voltage at node $N_c$ to discharge to ground, which completely shuts off transistor $M_1$. Further, the voltage at node $N_f$ is floating at $V_{dd}$. This capacitor can operate throughout the entire supply range from zero to $V_{dd}$.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An improved charge amplifier for amplifying an input signal on an input terminal and providing a final output signal on a final output terminal, said charge amplifier comprising:

an operational amplifier having a negative input, a positive input, and an amplifier output terminal for outputting an amplifier signal;

a feedback capacitor for routing said amplifier signal to said negative input;

a voltage reference selectively connected to said negative input;

a calibration capacitor connected between said amplifier output terminal and said final output terminal;

a first switch between said amplifier output terminal and said negative input;

a second switch between said voltage reference and said negative input;

a third switch placed so that the input signal can be selectively input to said negative input;

a fourth switch between a voltage level and said final output terminal; and a timing circuit connected to said first switch, said second switch, said third switch, and said fourth switch such that during a first time period, said first and fourth switches are closed and said second and third switches are open, during a second time period, said first and third switches are open and said second and fourth switches are closed, during a third time period, said first switch is closed and said second, third, and fourth switches are open, and during a fourth time period, said third switch is closed and said first, second, and fourth switches are open.

2. The charge amplifier of claim 1 wherein said voltage reference is carried by a reference capacitor.

3. The charge amplifier of claim 1 wherein said input signal is held by a source capacitor.

4. The charge amplifier of claim 1 wherein said voltage level is generated by a calibration voltage source connected to said fourth switch.

5. The charge amplifier of claim 1 further wherein said calibration capacitor and said feedback capacitor is formed from a MOS capacitor including

- a first series MOS transistor having a gate, a drain, and a source, said drain and said source of said first series MOS transistor tied together to form said input terminal;
- a second series MOS transistor having a gate, a drain, and a source, said drain and source of said second series MOS transistor tied together to form said output terminal, said gate of said second MOS transistor tied to the gate of said first MOS transistor; and
- a control MOS transistor having a gate, a drain, and a source, said drain of said control MOS transistor tied to said gates of said first and second series MOS transistors, said source of said control MOS transistor connected to a driving voltage source;
- whereby a control signal is applied to the gate of said control MOS transistor to activate said MOS capacitor.

6. The charge amplifier of claim 2 further wherein said calibration capacitor and said feedback capacitor is formed from a MOS capacitor including

- a first series MOS transistor having a gate, a drain, and a source, said drain and said source of said first series MOS transistor tied together to form said input terminal;
- a second series MOS transistor having a gate, a drain, and a source, said drain and source of said second series MOS transistor tied together to form said output terminal, said gate of said second MOS transistor tied to the gate of said first MOS transistor; and
- a control MOS transistor having a gate, a drain, and a source, said drain of said control MOS transistor tied to said gates of said first and second series MOS transistors, said source of said control MOS transistor connected to a driving voltage source;
- whereby a control signal is applied to the gate of said control MOS transistor to activate said MOS capacitor.

7. The charge amplifier of claim 3 further wherein said series capacitor and said feedback capacitor is formed from a MOS capacitor including

- a first series MOS transistor having a gate, a drain, and a source, said drain and said source of said first series MOS transistor tied together to form said input terminal;
- a second series MOS transistor having a gate, a drain, and a source, said drain and source of said second series MOS transistor tied together to form said output terminal, said gate of said second MOS transistor tied to the gate of said first MOS transistor; and
- a control MOS transistor having a gate, a drain, and a source, said drain of said control MOS transistor tied to said gates of said first and second series MOS transistors, said source of said control MOS transistor connected to a driving voltage source;
- whereby a control signal is applied to the gate of said control MOS transistor to activate said MOS capacitor.

8. A method for amplifying an input signal input to a charge amplifier, said charge amplifier including an operational amplifier having a negative input, a positive input, and an amplifier output terminal for outputting an amplifier signal, a feedback capacitor between said amplifier output terminal and said negative input, a voltage reference selectively connectable to said negative input, and a calibration capacitor connected between said amplifier output terminal and a final output terminal, the method comprising the steps of:

(a) equalizing the voltage between said negative input and said amplifier output terminal;

(b) setting said final output terminal to a predetermined voltage level;

(c) applying said reference voltage to said negative input such that said reference voltage is amplified by the combination of said operational amplifier and said feedback capacitor;

(d) equalizing the voltage between said negative input and said amplifier output terminal;

(e) applying said input signal to said negative input such that said input signal is amplified by the combination of said operational amplifier and said feedback capacitor; and (f) outputting on said final output terminal a final amplified signal.

9. The method of claim 8 wherein said final output terminal is allowed to float during step (d).

10. The method of claim 8 wherein said voltage reference is carried by a reference capacitor.

11. The method of claim 8 wherein said input signal is held by a source capacitor.

12. The method of claim 8 wherein said predetermined voltage level is generated by a calibration voltage source connected to said fourth switch.

* * * * *